(12) United States Patent
Chen

(10) Patent No.: US 7,301,109 B2
(45) Date of Patent: Nov. 27, 2007

(54) WEAR RESISTANT EMI SHIELD

(75) Inventor: Ga-Lane Chen, Fremont, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/141,088

(22) Filed: May 31, 2005

(65) Prior Publication Data
US 2005/0276978 A1    Dec. 15, 2005

(30) Foreign Application Priority Data
Jun. 10, 2004    (CN)    .................... 2004 1 0027652

(51) Int. Cl.
*H05K 9/00*    (2006.01)
(52) U.S. Cl. .............. 174/350; 174/357; 174/376; 174/388
(58) Field of Classification Search ............ 174/350, 174/357, 376, 388
See application file for complete search history.

(56) References Cited
U.S. PATENT DOCUMENTS
5,945,213 A     8/1999  Nagaike et al. ............ 428/336
6,274,808 B1 *  8/2001  Cercioglu et al. .......... 174/371
6,908,572 B1 *  6/2005  Derbyshire et al. ......... 252/502
2003/0143453 A1 * 7/2003  Ren et al. .................... 429/40
2003/0155143 A1 * 8/2003  Fujieda et al. ......... 174/35 MS

* cited by examiner

*Primary Examiner*—Jinhee Lee
(74) *Attorney, Agent, or Firm*—Morris Manning Martin LLP; Tim Tingkang Xia, Esq.

(57)    ABSTRACT

A wear resistant EMI shield includes a metallic film or multiple metallic films, and a carbon-nanotube coating (14) formed on the metallic film or multiple metallic films. The metallic films may include nickel film (12), copper film (13) and $Ni_xCu_{1-x}$ (x=0.62~0.99) (15) alloy film. In a preferred embodiment, the structure of the wear resistant EMI shield is CNT/Ni/Cu/Ni/. The thickness of metallic film is in the range from 20 to 100 nm and the thickness of carbon-nanotube coating is in the range from 10 to 200 nm. The wear resistant EMI shield may apply to various substrate surfaces (10) of electronic equipment, such as the shell of computer, play-station, wireless equipment, mobile phones, automobiles, airplanes, commercial appliance and consumer products, etc. The wear resistant EMI shield has good wear resistance, EMI shield effect, thin thickness and lightweight.

12 Claims, 2 Drawing Sheets

WEAR RESISTANT EMI SHIELD

TECHNICAL FIELD

The present invention relates to a shield against electromagnetic interference (EMI), and more specifically, to an EMI shield including a wear resistant layer on a surface thereof.

BACKGROUND

With the rapid development of an information-intensive society, electronic equipment such as PCs, mobile phones and notebooks have already become immensely popular. Electromagnetic waves are radiated from such equipment over various frequency bands, and the presence of such radiation in the environment is rapidly increasing. These electromagnetic waves are not only capable of interfering with the normal functioning of electronic equipment, but are also believed to be potentially harmful to human health. This kind of problem is often called the EMI effect. To solve the problem, an EMI shield is frequently employed as part of the structure of various electronic equipment. The EMI shield can absorb and cut off the propagation of electromagnetic waves, whether coming from outside the equipment or emanating from within the equipment.

A common structure of an EMI shield utilizes one or more metallic films as electromagnetic wave absorbing materials. The metallic films can absorb electromagnetic waves coming from outside, and thereby prevent wave propagation thereof into the equipment. Similarly, electromagnetic waves coming from within the equipment can be absorbed, thereby preventing wave propagation thereof out to other electronic equipment. The absorbed electromagnetic waves encounter electrical resistance, and are eventually converted to heat. Standard requirements of an EMI shield are as follows:

(a) Good electrical conductivity, in order to thoroughly cut off the propagation of electromagnetic waves.
(b) A wear resistant surface that protects the metallic films from abrasion and damage.
(c) Good thermal conductivity in order to avoid heat buildup.
(d) A low weight and thinness.

Because the wear resistance of metallic films is relatively poor, it is common for wear resistant ceramics or polymers to be coated on the surfaces of metallic films in order to protect the metallic films from abrasion and damage. Ceramic coating materials include oxide, nitride, carbide ceramics. However, both ceramics and polymers have poor electric conductivities that reduce the performance of the EMI shield. The thermal conductivities of these materials are also low, and the resultant heat buildup can cause unduly high temperatures. In addition, the thickness of a ceramic coating is generally from several tens of micrometers ($\mu$m) to hundreds of micrometers, which increases the thickness and weight of the electronic equipment.

In consideration of these problems, what is needed is an EMI shield with a wear resistant surface, good electric and thermal conductivities, a thin configuration, and a low weight.

SUMMARY

A wear resistant EMI shield that applies to various substrate surfaces of electronic equipment is provided. The wear resistant EMI shield includes sequentially a metallic film or multiple metallic films wherein at least one layer is nickel film; and a carbon-nanotube (CNT) coating formed on the surface of the metallic film or the metallic films. The metallic films may include copper (Cu) film, nickel (Ni) film and $Ni_xCu_{1-x}$ (x=0.62~0.99) alloy film. In a preferred embodiment, the structure of the wear resistant EMI shield is CNT/Ni/Cu/Ni/ and the thickness of metallic film is in the range from 20 to 100 nm and the thickness of carbon-nanotube coating is in the range from 10 to 200 nm.

The wear resistant EMI shield has excellent wear resistance and good EMI shield, because of the properties of carbon-nanotube, such as high hardness, good electric conductivity, good thermal conductivity and lightweight. The invention is used on many applications like computer, play-station, wireless equipment, mobile phones, automobiles, airplanes, commercial appliance and consumer products, etc.

Other advantages and novel features will be drawn from the following detailed description with reference to the attached drawings, in which:

DETAILED DESCRIPTION OF PREFERRED EMBODIMENTS

Hereinafter, preferred embodiments of the present invention will be described. However, the scope of the present invention is not to be taken as limited to the described embodiments.

Figure 1:
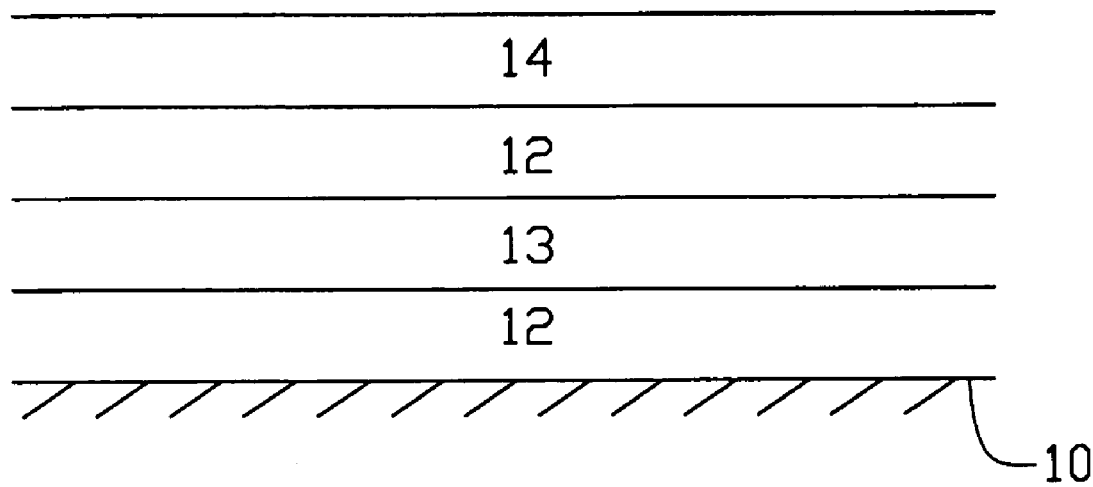
FIG. 1 is a schematic, cross-sectional view of part of an EMI shield with three metallic films and one carbon-nanotube coating according to a first preferred embodiment of the present invention.

FIG. 1 illustrates the first preferred embodiment of the invention, showing a schematic cross section of an EMI shield of electronic equipment with the structure of CNT/Ni/Cu/Ni/. The EMI shield is attached on a substrate surface 10, and sequentially comprises a nickel film 12, a copper film 13, a nickel film 12 and a carbon-nanotube coating 14. A thickness of each nickel film 12 is in the range from 20 to 100 nm, and preferably in the range from 30 to 50 nm. A thickness of the copper film 13 is in the range from 20 to 100 nm, and preferably in the range from 30 to 50 nm. A thickness of the carbon-nanotube coating 14 is in the range from 10 to 200 nm, and preferably in the range from 20 to 100 nm.

Figure 2:
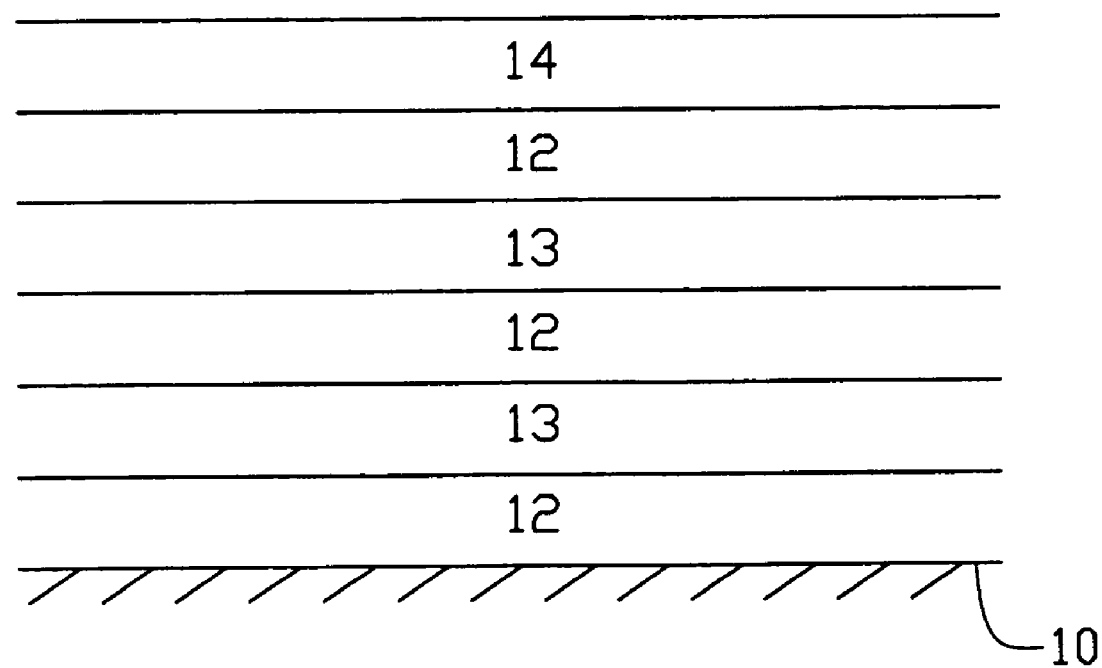
FIG. 2 is a schematic, cross-sectional view of part of an EMI shield with five metallic films and one carbon-nanotube coating according to a second preferred embodiment of the present invention.

FIG. 2 illustrates the second preferred embodiment of the invention, showing a schematic cross section of an EMI shield with the structure of CNT/Ni/Cu/Ni/Cu/Ni/. The EMI shield is attached on a substrate surface 10, and sequentially comprises a nickel film 12, a copper film 13, a nickel film 12, a copper film 13, a nickel film 12 and a carbon-nanotube coating 14. With an increased number of metallic films compared to the first preferred embodiment, the second preferred embodiment achieves a better EMI-shielding effect. Thicknesses of each of the nickel films 12, the copper films 13 and carbon-nanotube coating 14 are the same as those of the first preferred embodiment.

Processes for forming the first and second preferred embodiments are described below. A material of a substrate that provides the substrate surface 10 may be glass, metal, stainless steel, ceramic (e.g., oxide, nitride and/or carbide ceramic), plastics, a polymer, etc. Each nickel film 12 is deposited by a method of Thermal Evaporation or Electron-beam Evaporation. Each copper film 13 is deposited by a method of Thermal Evaporation or Electron-beam Evaporation. Alternatively, each copper film 13 may be sputtered by a method of DC Magnetron Sputtering, RF Diode Sputtering or RF Magnetron Sputtering. The carbon-nanotube coating 14 is formed by a method of Chemical Vapor Deposition (CVD) or Plasma Enhanced CVD.

Figure 3:
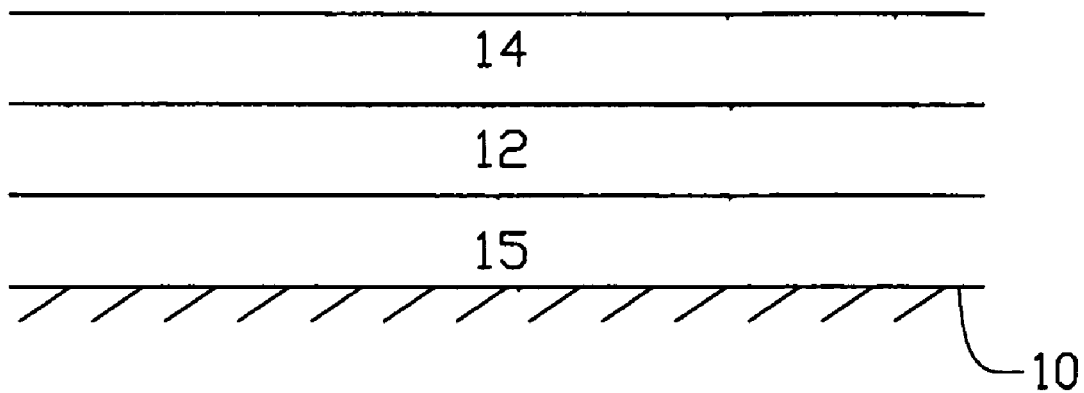
FIG. 3 is a schematic, cross-sectional view of part of an EMI shield with two metallic films and one carbon-nanotube coating according to a third preferred embodiment of the present invention.

FIG. 3 illustrates the third preferred embodiment of the invention, showing a schematic cross section of an EMI shield with the structure of CNT/Ni/Ni$_x$Cu$_{1-x}$/. The EMI shield is attached on a substrate surface 10, and sequentially comprises an Ni$_x$Cu$_{1-x}$ (x=0.62~0.99) alloy film 15, a nickel film 12 and a carbon-nanotube coating 14. A thickness of the Ni$_x$Cu$_{1-x}$ alloy film 15 is in the range from 20 to 100 nm, and preferably in the range from 30 to 50 nm. Thickness of the nickel film 12 and carbon-nanotube coating 14 is the same as those of the first preferred embodiment.

Figure 4:
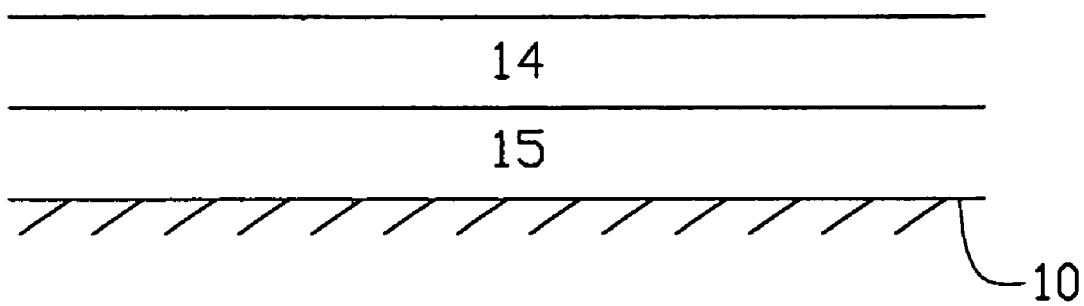
FIG. 4 is a schematic, cross-sectional view of part of an EMI shield with one metallic film and one carbon-nanotube coating according to a fourth preferred embodiment of the present invention.

FIG. 4 illustrates the fourth preferred embodiment of this invention, showing a schematic cross section of an EMI shield with the structure of CNT/Ni$_x$Cu$_{1-x}$/. The EMI shield is attached on a substrate surface 10, and sequentially comprises a Ni$_x$Cu$_{1-x}$ (x=0.62~0.99) alloy film 15 and a carbon-nanotube coating 14. Thicknesses of the Ni$_x$Cu$_{1-x}$ alloy film 15 and carbon-nanotube coating 14 are the same as those of the third preferred embodiment.

Processes for forming the third and fourth embodiments are described below. The Ni$_x$Cu$_{1-x}$ alloy film 15 is formed by a Sputtering or a Co-sputtering method. The Sputtering method uses a Ni$_x$Cu$_{1-x}$ alloy as a sputtering target, and the Ni$_x$Cu$_{1-x}$ alloy film 15 is formed by way of DC Magnetron Sputtering, RF Diode Sputtering or RF Magnetron Sputtering. The Co-sputtering method, also called Multi-layer Sputtering, uses pure argon gas to bombard pure Ni and Cu targets while simultaneously rotating a substrate at 50-60 rpm. By assigning different electrical input power to the Cu and Ni targets, a desired composition of the Ni$_x$Cu$_{1-x}$ alloy film 15 is obtained. Processes for forming the nickel film 12 and the carbon-nanotube coating 14 are the same as those of the first and second preferred embodiments.

Generally speaking, the process of growing carbon nanotubes needs a catalytic agent, such as iron, cobalt, nickel, and/or their metal oxides. In the above-described preferred embodiments, the nickel film 12 or the Ni$_x$Cu$_{1-x}$ alloy film 15 is adjacent the carbon-nanotube coating 14. Therefore no additional catalytic film is necessary.

Each nickel film 12 is a ferromagnetic material having high magnetic permeability. Each copper film 13 has good electrical conductivity. The carbon nanotube coating 14 has high strength (100 times that of steel fiber), high Young's modulus (1.4 Tpa, cf. 200 Gpa for steel), good thermal conductivity (twice that of diamond), and excellent electric conductivity. The thicknesses of each nickel film 12, copper film 13 and the carbon-nanotube coating 14 are minimal, thereby making the EMI shield lightweight. Combining all the advantages of these films, the present invention provides a thin yet wear resistant EMI shield.

As indicated above, the present invention provides great utility. Although only preferred embodiments of the present invention have been described in detail above, it will be apparent to those skilled in the art that various modifications are possible without departing from the inventive concepts herein. Therefore the invention is not limited to the above-described embodiments, but rather has a scope defined by the appended claims and allowable equivalents thereof.

What is claimed is:

1. A wear resistant electromagnetic interference (EMI) shield for application to various substrate surfaces of electronic equipment, comprising sequentially:
   a metallic film or multiple metallic films in which at least one film contains nickel; and
   a carbon-nanotube (CNT) coating formed on a surface of said metallic film or multiple metallic films;
   wherein said metallic film or multiple metallic films cooperate with the carbon-nanotube coating to shield EMI coming from the electronic equipment; and
   said multiple metallic films include one copper film and two nickel films, with the EMI shield having a structure of CNT/Ni/Cu/Ni/.

2. A wear resistant electromagnetic interference (EMI) shield for application to various substrate surfaces of electronic equipment, comprising sequentially:
   a metallic film or multiple metallic films in which at least one film contains nickel; and
   a carbon-nanotube (CNT) coating formed on a surface of said metallic film or multiple metallic films;
   wherein said metallic film or multiple metallic films cooperate with the carbon-nanotube coating to shield EMI coming from the electronic equipment; and
   said multiple metallic films include two copper films and three nickel films, with the EMI shield having a structure of CNT/Ni/Cu/Ni/Cu/Ni/.

3. A wear resistant electromagnetic interference (EMI) shield for application to various substrate surfaces of electronic equipment, comprising sequentially:
   a metallic film or multiple metallic films in which at least one film contains nickel; and
   a carbon-nanotube (CNT) coating formed on a surface of said metallic film or multiple metallic films;
   wherein said metallic film or multiple metallic films cooperate with the carbon-nanotube coating to shield EMI coming from the electronic equipment; and
   said multiple metallic films include one nickel film and one Ni$_x$Cu$_{1-x}$ (x=0.62~0.99) alloy film, with the EMI shield having a structure of CNT/Ni/Ni$_x$Cu$_{1-x}$.

4. A wear resistant electromagnetic interference (EMI) shield for application to various substrate surfaces of electronic equipment, comprising sequentially:
   a metallic film or multiple metallic films in which at least one film contains nickel; and
   a carbon-nanotube (CNT) coating formed on a surface of said metallic film or multiple metallic films;
   wherein said metallic film or multiple metallic films cooperate with the carbon-nanotube coating to shield EMI coming from the electronic equipment; and
   said metallic film or multiple metallic films includes or include one Ni$_x$Cu$_{1-x}$ (x=0.62~0.99) alloy film, with the EMI shield having a structure of CNT/Ni$_x$Cu$_{1-x}$.

5. The wear resistant EMI shield according to claim 1, wherein a thickness of said copper film is in the range from 20 to 100 nm.

6. The wear resistant EMI shield according to claim 5, wherein the thickness of said copper film is in the range from 30 to 50 nm.

7. The wear resistant EMI shield according to claim 1, wherein a thickness of the at least one film containing nickel is in the range from 20 to 100 nm.

8. The wear resistant EMI shield according to claim 7, wherein the thickness of the at least one film containing nickel is the range from 30 to 50 nm.

9. The wear resistant EMI shield according to claim 1, wherein a thickness of said $Ni_xCu_{1-x}$ (x=0.62~0.99) alloy film is in the range from 20 to 100 nm.

10. The wear resistant EMI shield according to claim 9, wherein the thickness of said $Ni_xCu_{1-x}$ (x=0.62~0.99) alloy film is in the range from 30 to 50 nm.

11. The wear resistant EMI shield according to claim 1, wherein a thickness of said carbon-nanotube coating is in the range from 10 to 200 nm.

12. The wear resistant EMI shield according to claim 11, wherein the thickness of said carbon-nanotube coating is in the range from 20 to 100 nm.

* * * * *